Figure 1:
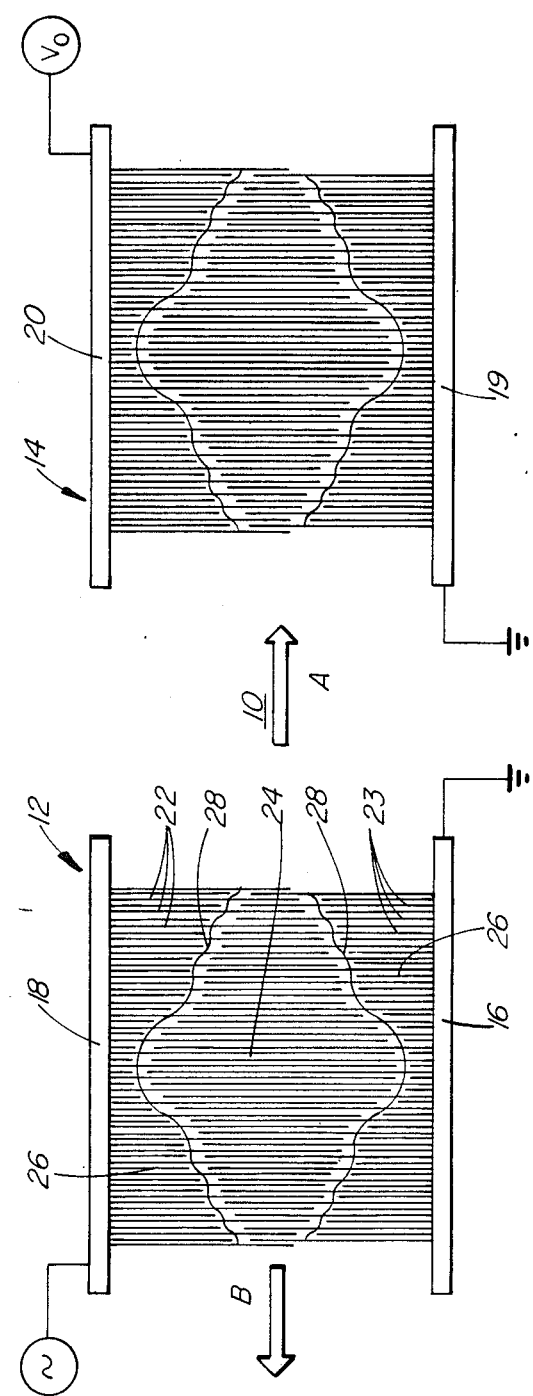

United States Patent [19]

Este

[11] Patent Number: 4,680,497

[45] Date of Patent: Jul. 14, 1987

[54] SURFACE ACOUSTIC WAVE DEVICES

[75] Inventor: Grantley O. Este, Stittsville, Canada

[73] Assignee: Northern Telecom Limited, Montreal, Canada

[21] Appl. No.: 856,553

[22] Filed: Apr. 28, 1986

[51] Int. Cl.$^4$ ............................................. H01L 41/08
[52] U.S. Cl. ................................ 310/313 C; 333/154; 333/196
[58] Field of Search ............ 310/313 R, 313 A, 313 B, 310/313 C, 313 D; 333/150-155, 193-196

[56] References Cited

U.S. PATENT DOCUMENTS

| | | | |
|---|---|---|---|
| 4,023,124 | 5/1977 | Parker et al. | 310/313 C X |
| 4,144,508 | 3/1979 | Lewis et al. | 310/313 C X |
| 4,333,065 | 6/1982 | DeVries | 310/313 C X |
| 4,426,595 | 1/1984 | Kawaura et al. | 310/313 D |
| 4,604,595 | 8/1986 | Kadota | 310/313 C X |

Primary Examiner—Mark O. Budd
Attorney, Agent, or Firm—R. John Haley

[57] ABSTRACT

An interdigitated transducer (IDT) has parallel electrodes extending inwardly from one voltage rail and parallel electrodes extending inwardly from another voltage rail. The respective electrodes are interleaved to give a region of overlap or apodization within which the SAW is generated or received, the width of the apodized area varying along the length of the IDT. To prevent performance degradation in the event of an open circuit in a non-overlap region, the electrodes associated with a particular voltage rail are additionally linked by a thin conductor positioned near the boundaries between the apodized or overlap region and each of the non-overlap regions.

6 Claims, 2 Drawing Figures

SURFACE ACOUSTIC WAVE DEVICES

This invention relates to surface acoustic wave (SAW) devices. As is well known, a SAW device comprises an input interdigitated transducer (IDT) and an output IDT which are arranged in spaced relationship on a piezoelectric substrate for propagation of a SAW between them.

Typically an IDT consists of first and second parallel voltage rails with a plurality of parallel elongate electrodes extending inwardly from one voltage rail and a corresponding plurality of elongate electrodes extending inwardly from the other voltage rail. The electrodes associated with the two rails overlap at a central area. The SAW is developed when an AC signal is applied between the rails. The characteristics of the SAW produced in the piezoelectric substrate depend among other things on the degree of overlap or apodization of the electrodes. Electrodes formed in regions of no overlap serve little purpose in the generation of the SAW but insure that despite any variation in overlap or apodization width over the length of the IDT, the wave front of the developed SAW extends parallel to the electrodes.

Since the individual electrodes and the spacing between adjacent electrodes may be very narrow, of the order of 1.0 micron, and the number of electrodes is very large, it is difficult to avoid the formation of short or open circuits during SAW fabrication. If a short or open circuit exists in the overlap or apodized region, it degrades the performance of the transducer. Similarly an open circuit in the non-overlap region produces a degraded performance since the electrodes in the overlap region associated with this open circuit cannot be actively driven. A short circuit in the non-overlap region has little effect if it is not too large an area since all the electrodes in this non-overlap region are of the same polarity.

By the invention the effect of an open circuit in a non-overlap region is obviated by joining all the electrodes associated with a particular voltage rail by a thin conductor positioned near the boundary between the overlap region and the non-overlap regions.

According to the invention, there is provided a surface acoustic wave (SAW) device having an interdigitated transducer (IDT) comprising first and second voltage rails, first and second pluralities of parallel conducting electrodes extending inwardly from respective voltage rails, said rails and said electrodes formed on a piezoelectric substrate, electrodes of said first plurality being interleaved with electrodes of said second plurality to establish an interleaved or apodized area adjacent to said non-interleaved area, said apodized area varying in width along the IDT, the electrodes in the non-interleaved areas being electrically linked by a linking conductor extending close to a boundary between the apodized area and the non-interleaved area.

The apodized area is typically a central area flanked by non-interleaved areas which are mirror images of one another. The electrodes in each of the non-interleaved areas can be electrically linked by first and second such linking conductors extending close to respective boundaries between the central area and the flanking areas.

The linking conductors can be homogeneous extensions of respective IDT electrode pluralities and are preferably spaced from the apodized area by at least four times the width of said electrodes.

To avoid differential SAW propagation through the width of the SAW device, the linking conductors can consist of a series of interconnected segments, certain of these segments being parts of IDT electrodes and the other segments extending parallel to the SAW propagation direction.

Alternatively, the SAW propagation velocity reduction owing to propagation under the linking conductors is substantially compensated by SAW propagation velocity increase owing to propagation in respective gaps between the linking conductors and the apodized area.

Figure 2:
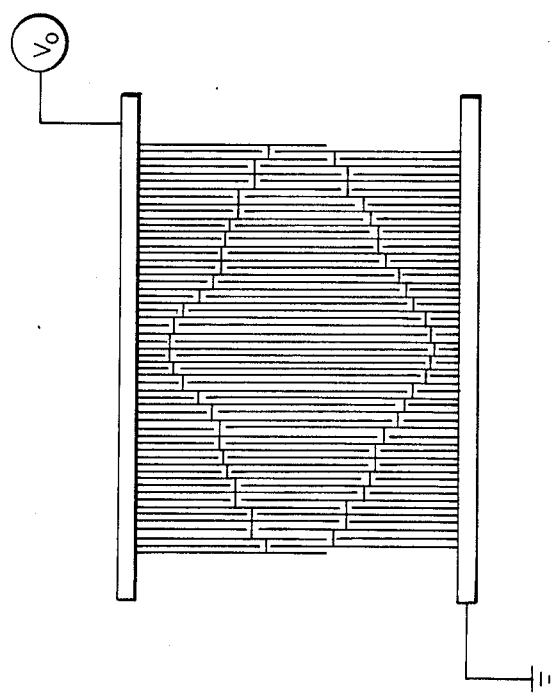

An embodiment of the invention will now be described by way of example with reference to the accompanying drawings in which:

FIG. 1 shows a plan view to an enlarged scale of a SAW device according to the invention; and FIG. 2 is a plan view of an alternative form of IDT.

Referring in detail to FIG. 1, the illustrated SAW device has a piezoelectric substrate 10 onto which are vacuum deposited patterns of aluminum comprising an input or transmitting transducer 12 and an output or receiving transducer 14. In practice, the electrodes of the IDTs may be in more dense an array than is shown.

The input transducer has opposed voltage rails 16, 18, rail 16 being grounded and rail 18 having an input signal applied to it. Similarly the output transducer has voltage rails 19, 20, the rail 19 being grounded and an output signal being obtained from the rail 20. Between the voltage rails of each IDT extend respective sets of interdigitated fingers or electrodes 22, 23. The fingers have a line width and spacing of nominally 1.6 microns. The extent of overlap of the fingers varies in the SAW transmission direction A. This overlap or apodization defines the frequency response of the transducer.

With the narrow electrodes and interelectrode spacing, it is relatively easy during fabrication to obtain a short circuit or open circuit in the electrode array. If a short or open circuit occurs in the overlap region indicated as 24, it can degrade the performance of the device. Similarly if an open circuit occurs in outer regions 26 where there is no overlap of electrodes 22, 23 there is a similar degradation in IDT performance since any electrode in the overlap region which is associated with that open circuit is not actively driven. Depending on the weighting of that electrode, i.e. the extent of the overlap, the device bandwidth and roll off are affected by such an open circuit.

To compensate for the presence of any open circuits within the non-overlap regions 26 the electrodes associated with each voltage rail have an additional linking conductor 28 which essentially follows the boundary between the overlap and non-overlap regions but is 5 microns outside the overlap region 24. These supplementary links insure that despite any open circuits in regions 26, the electrodes extending from that open circuit into the overlap region 24 are linked to an appropriate one of the voltage rails. The linking conductors have an aspect ratio (length to width) about one quarter that of the electrodes in order to minimize resistive losses in the conductors. In practice, the conductors have a width of about 1.5 microns being the lower limit permitted by current photolithographic techniques.

A wide linking conductor or a solid conducting layer extending completely over the non-overlap areas 26 is undesirable since it changes the SAW propagation characteristic in those areas. Consequently it is preferred that parallel electrodes 22, 23 fill the entire region between the upper and lower voltage rails 16, 18 with the voltage rails being spaced by distances marginally greater than the greatest apodized or overlap width.

The linking conductors 28 on either side of the central apodized region 24 are deposited at the same time as the electrodes 22, 23 and voltage rails 16, 18. In the specific embodiment illustrated, the output transducer pattern is identical to the input transducer pattern but it will be realized that the emitting and receiving IDTs may be different from one another.

In use high frequency AC voltage is applied to the input transducer voltage rail 18 so as to generate a rapidly varying stress wave or SAW at the surface of the piezoelectric material 10. The SAW propagates in both directions A and B but the unwanted wave in direction B is dumped in an absorber (not shown). When the SAW propagating in direction A reaches the output transducer 14, a reverse piezoelectric action occurs and an output signal is generated at the output IDT voltage rail 20.

The presence of the linking conductors 28 have little effect on the output SAW or on the induced voltage generated at the receiving IDT. However, as previously mentioned, it is preferable that the electrodes 22, 23 in the non-overlap regions 26 should present a transmission medium which is as much like the central SAW generating region 24 as possible. Clearly the presence of the linking conductors 28 does detract slightly from this.

The linking conductors affect the signal response in a number of ways. Firstly acoustic energy is scattered by the edges of the metal conductors. This effect is very small and can be eliminated by making the linking conductors parallel to the propagation direction segment by segment as shown in FIG. 2.

The second effect is due to the reduced velocity of the SAW under a conductor. Change in propagation velocity caused by adding the linking conductors 28 is similar in magnitude to the velocity change introduced by removing part of an electrode for apodization of the transducer but is opposite in sign. By adjusting the size and location of the linking conductors it is possible substantially to cancel the two effects.

What is claimed is:

1. A surface acoustic wave (SAW) device having an interdigitated transducer (IDT) comprising first and second voltage rails, first and second pluralities of parallel conducting electrodes extending inwardly from respective voltage rails, said rails and said electrodes formed on a piezoelectric substrate, electrodes of said first plurality being interleaved with electrodes of said second plurality to establish an interleaved or apodized area adjacent to a non-interleaved area, said apodized area varying in width along the IDT, the electrodes in the non-interleaved areas being electrically linked by a linking conductor extending close to a boundary between the apodized area and the non-interleaved area.

2. A SAW device as claimed in claim 1 in which the apodized area is a central area flanked by non-interleaved areas, the electrodes in each of the non-interleaved areas being electrically linked by first and second such linking conductors extending close to respective boundaries between the central area and the flanking areas.

3. A SAW device as claimed in claim 2 in which the linking conductors are homogeneous extensions of respective IDT electrode pluralities.

4. A SAW device as claimed in claim 2 in which the linking conductors are spaced from the apodized area by at least four times the width of said electrodes.

5. A SAW device as claimed in claim 2 in which each of the linking conductors consists of a series of interconnected segments, certain of the segments being parts of IDT electrodes and the other segments extending parallel to the SAW propagation direction.

6. A SAW device as claimed in claim 2 in which SAW propagation velocity reduction owing to propagation under the linking conductors is substantially compensated by SAW propagation velocity increase owing to propagation in areas adjacent said linking conductors, which areas are not covered by electrodes.

* * * * *